US011581686B2

(12) United States Patent
Oosaka et al.

(10) Patent No.: US 11,581,686 B2
(45) Date of Patent: Feb. 14, 2023

(54) ELECTRICAL CONNECTOR ASSEMBLY WITH OUTER SHIELDING SHELL AND INNER SHIELDING PLATE BETWEEN TERMINALS

(71) Applicant: JAPAN AVIATION ELECTRONICS INDUSTRY, LIMITED, Tokyo (JP)

(72) Inventors: Junji Oosaka, Tokyo (JP); Yohei Yokoyama, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 17/735,819

(22) Filed: May 3, 2022

(65) Prior Publication Data
US 2022/0263275 A1    Aug. 18, 2022

Related U.S. Application Data

(62) Division of application No. 17/199,895, filed on Mar. 12, 2021.

(30) Foreign Application Priority Data

May 13, 2020   (JP) .............................. JP2020-084468
May 26, 2020   (JP) .............................. JP2020-091146
(Continued)

(51) Int. Cl.
*H01R 13/6581*   (2011.01)
*H01R 12/71*     (2011.01)
(Continued)

(52) U.S. Cl.
CPC ....... *H01R 13/6581* (2013.01); *H01R 12/712* (2013.01); *H01R 12/716* (2013.01);
(Continued)

(58) Field of Classification Search
CPC ............. H01R 13/6581; H01R 12/712; H01R 12/716; H01R 12/73; H01R 13/648;
(Continued)

(56) References Cited

U.S. PATENT DOCUMENTS 11,444,414 B2 *   9/2022   Shimomura ........... H01R 13/50
2017/0033510 A1 * 2/2017   Ozeki .................. H01R 43/205

FOREIGN PATENT DOCUMENTS

JP        2017-33654 A      2/2017

* cited by examiner

*Primary Examiner* — Abdullah A Riyami
*Assistant Examiner* — Justin M Kratt
(74) *Attorney, Agent, or Firm* — Greenblum & Bernstein, P.L.C.

(57) ABSTRACT

In a connector assembly in which a first connector that includes a first insulator, first terminals, and a first shell and is mounted on a first board and a second connector that includes a second insulator, second terminals, and a second shell and is mounted on a second board are connected with each other, a first ground pattern that has a frame-like shape and is formed on the first board is soldered to the first shell with first solder, and a second ground pattern that has a frame-like shape and is formed on the second board is soldered to the second shell with second solder. An inner space in which the first terminals and the second terminals are positioned is completely shielded from the outside without any gap.

1 Claim, 10 Drawing Sheets

(30) Foreign Application Priority Data

| | | | |
|---|---|---|---|
| Jun. 12, 2020 | (JP) | ............................ | JP2020-102280 |
| Jun. 18, 2020 | (JP) | ............................ | JP2020-105098 |
| Jul. 14, 2020 | (JP) | ............................ | JP2020-120397 |
| Jul. 16, 2020 | (JP) | ............................ | JP2020-121984 |
| Aug. 5, 2020 | (JP) | ............................ | JP2020-132981 |
| Aug. 25, 2020 | (JP) | ............................ | JP2020-141324 |

(51) Int. Cl.

| | |
|---|---|
| *H01R 12/73* | (2011.01) |
| *H01R 13/6594* | (2011.01) |
| *H01R 13/648* | (2006.01) |
| *H05K 1/02* | (2006.01) |
| *H05K 1/18* | (2006.01) |
| *H01R 24/00* | (2011.01) |
| *H01R 13/6582* | (2011.01) |
| *H01R 13/658* | (2011.01) |

(52) U.S. Cl.
CPC ........... *H01R 12/73* (2013.01); *H01R 13/648* (2013.01); *H01R 13/6594* (2013.01); *H01R 12/71* (2013.01); *H01R 13/658* (2013.01); *H01R 13/6582* (2013.01); *H01R 24/00* (2013.01); *H05K 1/0224* (2013.01); *H05K 1/18* (2013.01)

(58) Field of Classification Search
CPC .. H01R 13/6594; H01R 12/71; H01R 13/658; H01R 13/6582; H01R 24/00; H05K 1/0224; H05K 1/18
See application file for complete search history.

ELECTRICAL CONNECTOR ASSEMBLY WITH OUTER SHIELDING SHELL AND INNER SHIELDING PLATE BETWEEN TERMINALS

CROSS-REFERENCE TO RELATED APPLICATIONS

This application is a divisional application of U.S. patent application Ser. No. 17/199,895, filed on Mar. 12, 2021, which claims priority to Japanese Patent Application No. 2020-084468, filed on May 13, 2020, Japanese Patent Application No. 2020-091146, filed on May 26, 2020, Japanese Patent Application No. 2020-102280, filed on Jun. 12, 2020, Japanese Patent Application No. 2020-105098, filed on Jun. 18, 2020, Japanese Patent Application No. 2020-120397, filed on Jul. 14, 2020, Japanese Patent Application No. 2020-121984, filed on Jul. 16, 2020, Japanese Patent Application No. 2020-132981, filed on Aug. 5, 2020, and Japanese Patent Application No. 2020-141324, filed on Aug. 25, 2020. The entire disclosure of each of the above-identified applications, including the specification, drawings, and claims, is incorporated herein in its entirety by reference.

TECHNICAL FIELD

The present invention relates to a connector assembly in which two board-to-board connectors respectively mounted on two boards are connected with each other.

BACKGROUND ART

FIGS. 1A, 1B, 2A, and 2B illustrate the structure of the connector assembly disclosed in Japanese Patent Application Laid Open No. 2017-33654. FIGS. 1A and 1B illustrate a first board-to-board connector 10 constituting the connector assembly and FIGS. 2A and 2B illustrate a second board-to-board connector 20 constituting the connector assembly. The board-to-board connectors are referred to simply as the connectors hereinafter.

The first connector 10 and the second connector 20 respectively include insulation housings 11 and 21 that are elongated. Many signal contacts 13 are aligned at a predetermined pitch along the longitudinal direction of the insulation housing 11 and many signal contacts 23 are aligned at a predetermined pitch along the longitudinal direction of the insulation housing 21 (multipolar connectors).

The insulation housing 11 includes base end portions 11a respectively on both end portions in the longitudinal direction thereof (connector longitudinal direction) and the insulation housing 21 includes base end portions 21a respectively on both end portions in the longitudinal direction thereof (connector longitudinal direction). A central convex portion 11b which is elongated is formed between the two base end portions 11a and a central concave portion 21b which is elongated is formed between the two base end portions 21a.

A conductive shell 12 is a shielding wall portion facing the signal contacts 13 and is attached to the insulation housing 11. A conductive shell 22 is a shielding wall portion facing the signal contacts 23 and is attached to the insulation housing 21. The conductive shell 12 surrounds an outer circumferential portion of the insulation housing 11 and the conductive shell 22 surrounds an outer circumferential portion of the insulation housing 21.

The conductive shell 12 includes two L-shaped metal parts. The two metal parts constitute a frame structure. Ground connection portions 12b are formed on the lower edge portion of a longitudinal side wall plate 12a of the conductive shell 12.

The ground connection portions 12b are aligned at a predetermined interval. In a region between adjacent two ground connection portions 12b, a side inspection window 12c is formed. The side inspection window 12c is a space allowing visual observation for board connection end portions 13a of the signal contacts 13. The length in the connector longitudinal direction of the side inspection window 12c corresponds to the length with which three board connection end portions 13a can be visually observed. A connection state of the board connection end portions 13a or a connector assembly state can be confirmed through the side inspection window 12c.

A plane cover 12d is provided on an upper edge portion of the longitudinal side wall plate 12a of the conductive shell 12. Contact pieces 12e are formed at a predetermined interval on a part straddling a boundary between the plane cover 12d and the longitudinal side wall plate 12a. The contact piece 12e is formed by cutting a part of the metal part and slightly raising the cut part.

The conductive shell 22 includes two metal parts having a staple-like shape. The two metal parts constitute a frame structure. Ground connection portions 22b are formed on the lower edge portion of a longitudinal side wall plate 22a of the conductive shell 22.

The ground connection portions 22b are aligned at a predetermined interval. In a region between adjacent two ground connection portions 22b, a side inspection window 22c is formed. The side inspection window 22c is a space allowing visual observation for board connection end portions 23a of the signal contacts 23. The length in the connector longitudinal direction of the side inspection window 22c corresponds to the length with which three board connection end portions 23a can be visually observed. A connection state of the board connection end portions 23a or a connector assembly state can be confirmed through the side inspection window 22c.

In a state in which the first connector 10 and the second connector 20 which are mounted on two wiring boards are fitted to each other, the conductive shell 22 provided to the second connector 20 covers the outer circumference of the first connector 10 from the outside and an inner wall surface of the conductive shell 22 is in elastically contact with the contact pieces 12e formed on the conductive shell 12 of the first connector 10. Accordingly, the conductive shell 12 and the conductive shell 22 are ground-connected with each other.

It is important to enhance countermeasures against EMI in board-to-board connectors depending on downsizing, high-density mounting, or use of high frequency electric signals in electronic equipment using the board-to-board connectors.

According to the above-mentioned connector assembly, the first connector 10 and the second connector 20 respectively include the conductive shell 12 and the conductive shell 22, and the conductive shell 12 and the conductive shell 22 realize electromagnetic shielding. However, as the conductive shell 12 and the conductive shell 22 respectively have the side inspection windows 12c and the side inspection windows 22c, electromagnetic leakage from the side inspection windows 12c and 22c occurs, degrading the shielding effect.

BRIEF SUMMARY OF THE INVENTION

An object of the present invention is to provide a connector assembly that exerts excellent electromagnetic shielding performance. In the connector assembly, two board-to-board connectors respectively mounted on two boards are connected to each other.

The following technical matters are described simply to facilitate the understanding of the main points of the present invention, not to limit the invention claimed in the claims explicitly or implicitly and not to express the possibility of accepting such a limitation that is imposed by a person other than those who will benefit from the present invention (for example, the applicant and the right holder). The general outline of the present invention described from other perspectives can be understood from, for example, the claims of this application as originally filed at the time of application.

The connector assembly has a structure in which parts other than a shell of one board-to-board connector, a shell of the other board-to-board connector, and solder are not seen in a side view of the connector assembly.

These and other objects, features and advantages of the present invention will become apparent from the detailed description taken in conjunction with the accompanying drawings.

EFFECTS OF THE INVENTION

The connector assembly according to the present invention exerts excellent electromagnetic shielding performance.

BRIEF DESCRIPTION OF THE DRAWINGS

The subject matter, which is regarded as the invention, is particularly pointed out and distinctly claimed in the claims at the conclusion of the specification. The present invention itself, and manner in which it may be made or used, if any, may be better understood after a review of the following description in connection with the accompanying drawings in which:

LIST OF REFERENCE NUMERALS

Figure 1A:
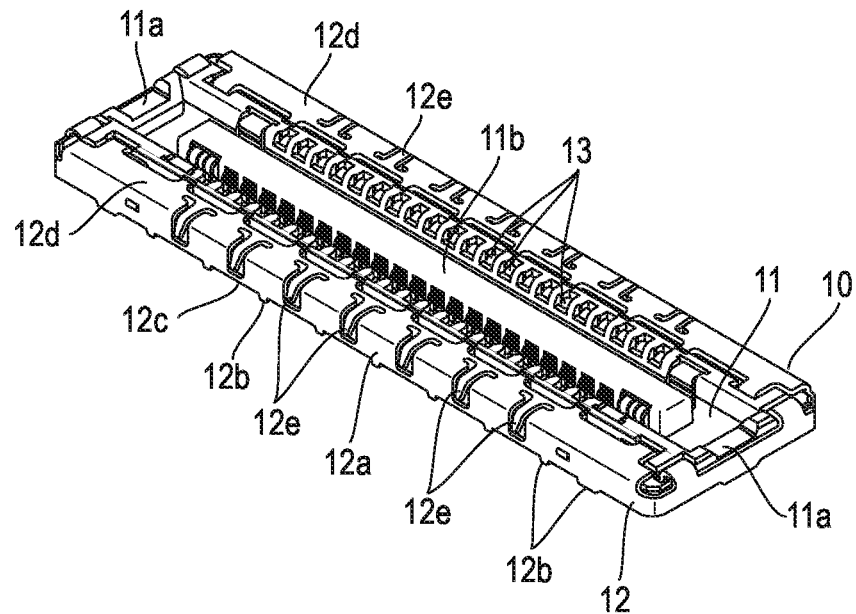
FIG. 1A is a perspective view illustrating a first connector constituting a connector assembly (prior art)
Figure 1B:
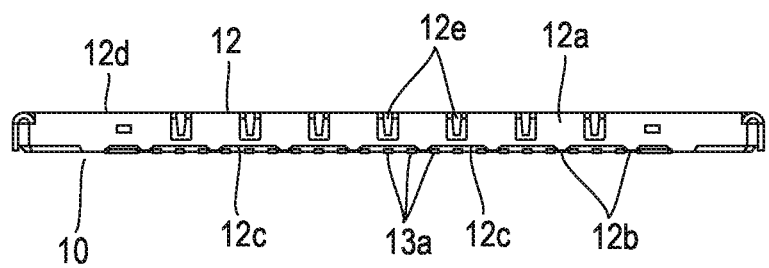
FIG. 1B is a front elevational view illustrating the first connector constituting the connector assembly (prior art)
Figure 2A:
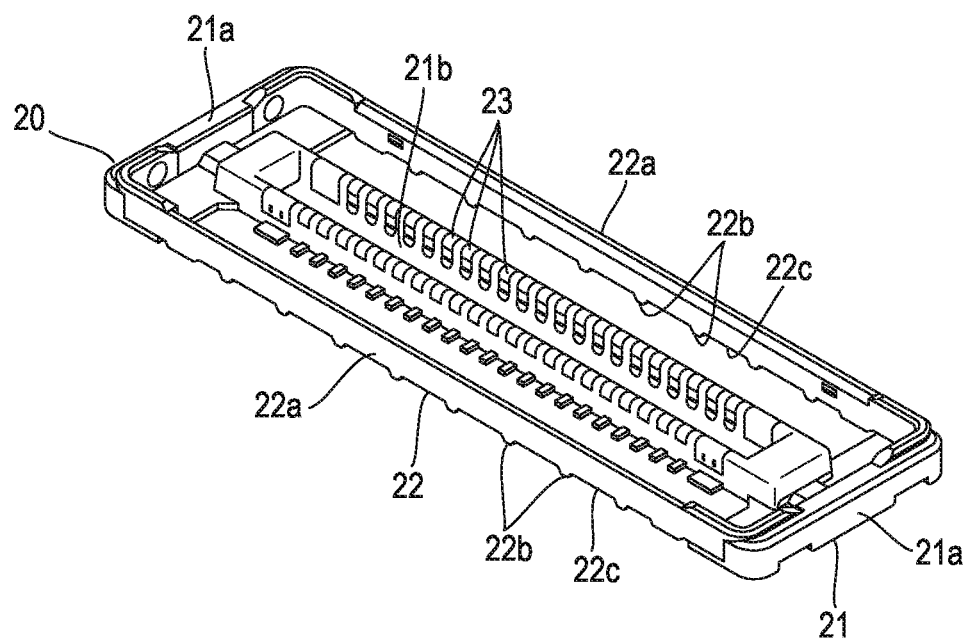
FIG. 2A is a perspective view illustrating a second connector constituting the connector assembly (prior art)
Figure 2B:
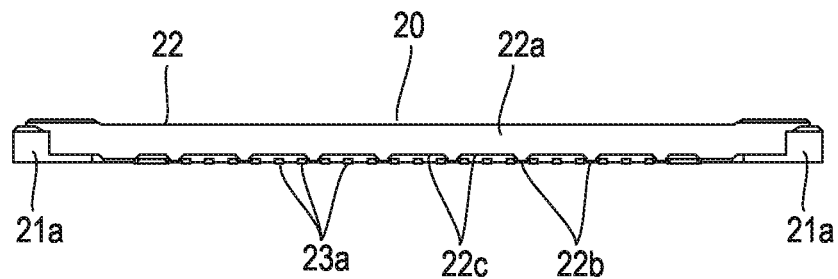
FIG. 2B is a front elevational view illustrating the second connector constituting the connector assembly (prior art)

With regard to reference numerals used, the following numbering is used throughout the drawings.

10: first connector
11: insulation housing
11a: base end portion
11b: central convex portion
12: conductive shell
12a: longitudinal side wall plate
12b: ground connection portion
12c: side inspection window
12d: plane cover
12e: contact piece
13: signal contact
13a: board connection end portion
20: second connector
21: insulation housing
21a: base end portion
21b: central concave portion
22: conductive shell
22a: longitudinal side wall plate
22b: ground connection portion
22c: side inspection window
23: signal contact
23a: board connection end portion
30: first insulator
31: concave portion
32: slit
41, 42: first terminal
41a, 42a: contact portion
41b, 42b: connection portion
50: first shell
51, 52: side wall portion
51a, 52a: curved portion
53: extending portion
53a: raised portion
53b: protrusion
54: bent portion
54a: leg portion
55: first cutout
56: gap
57: first cutout
58: notch
60: second insulator
61: bottom plate portion
62: side wall
63: concave portion
71, 72: second terminal
71a, 72a: connection portion
73: shielding plate
73a: columnar portion
73b: extending portion 80: second shell
81, 82: side wall portion
81a, 82a: convex portion
81b: extending portion
82b: protrusion
83: coupling portion
84, 85: second cutout
86: second cutout
87: second cutout portion
100: first connector
200: second connector
300: first board
310: first ground pattern
320: first solder
400: second board
410: second ground pattern
420: second solder

DETAILED DESCRIPTION

An embodiment of the present invention will be described with reference to the accompany drawings. A connector assembly according to the embodiment includes a first connector 100 and a second connector 200.

Figure 3A:
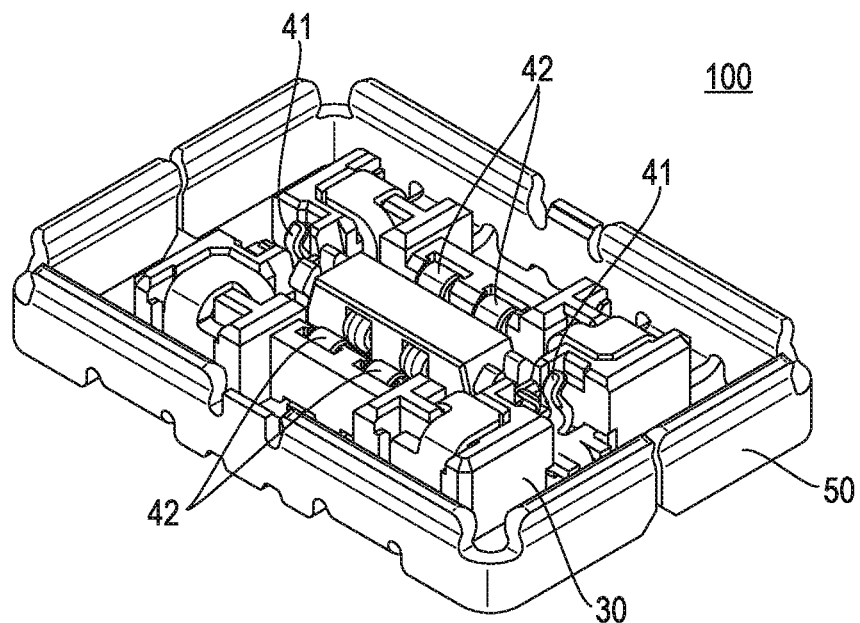
FIG. 3A is an upper perspective view illustrating a first connector constituting a connector assembly according to an embodiment.
Figure 3B:
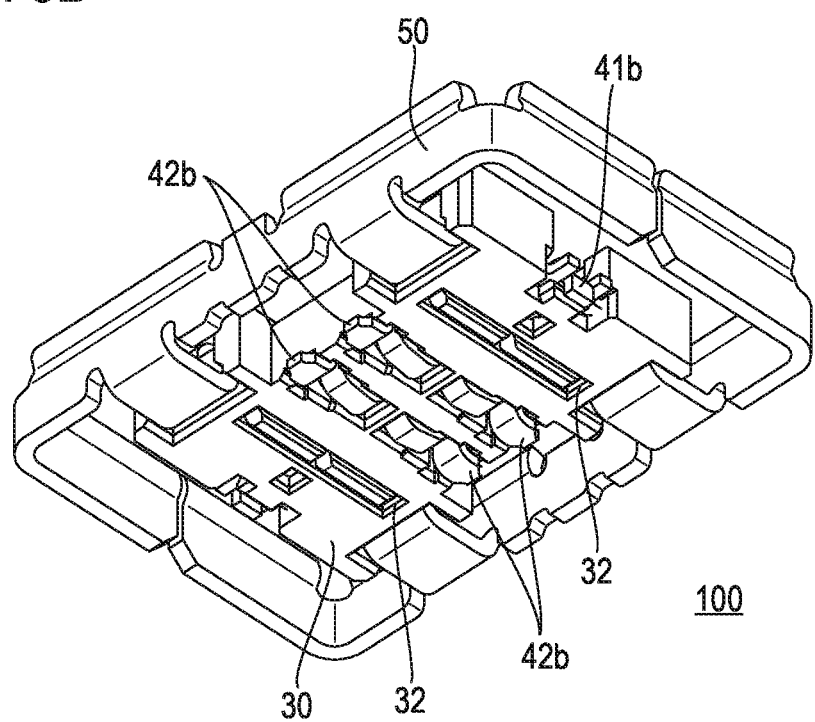
FIG. 3B is a lower perspective view illustrating the first connector constituting the connector assembly according to the embodiment.
Figure 4:
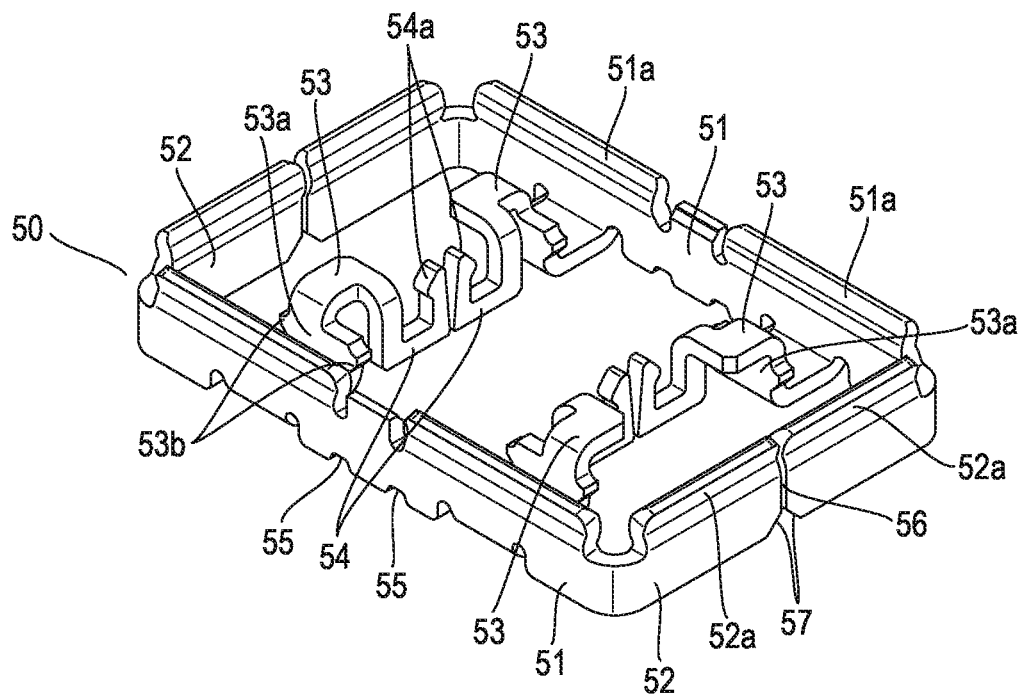
FIG. 4 is a perspective view illustrating a first shell included in the first connector.
Figure 5:
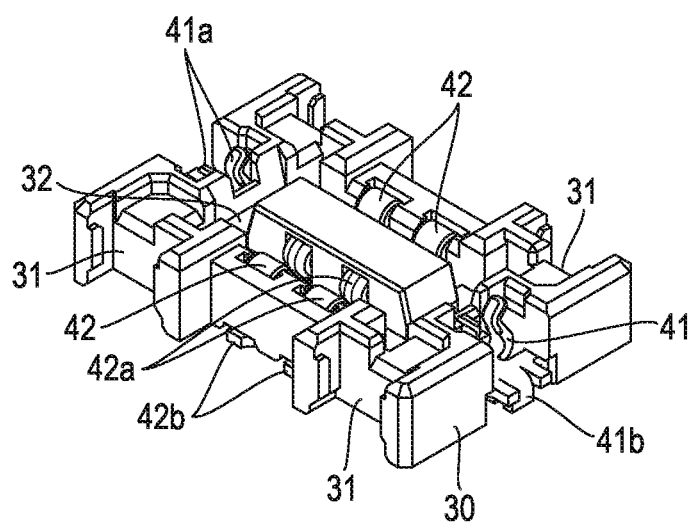
FIG. 5 is a perspective view illustrating a first insulator included in the first connector (where first terminals are attached to the first insulator which is illustrated)

FIGS. 3A and 3B illustrate the first connector 100. The first connector 100 includes a first insulator 30, first terminals 41 and 42 which are held by the first insulator 30, and a first shell 50 which is an outer shell of the first connector 100 and has conductivity and a rectangular frame-like shape. FIG. 4 illustrates details of the first shell 50 and FIG. 5 illustrates the first connector 100 whose first shell 50 is detached.

The first insulator 30 is made of resin and has a substantially rectangular parallelepiped shape as a whole. The first terminal 41 is attached to each of longitudinal end portions of the first insulator 30, and four first terminals 42 are attached to the central portion of the first insulator 30.

The first terminal 41 has two contact portions 41a which face each other, and the first terminal 42 has two contact portions 42a which face each other. Connection portions 41b and 42b, which are to be connected with the first board, of the first terminals 41 and 42 are positioned on the bottom surface of the first insulator 30. In this example, the first terminal 41 is used for transmission of a high frequency signal (high speed transmission), and the first terminal 42 is used for transmission of a low frequency signal (low speed transmission).

The first shell 50 includes two metal parts each of which has a staple-shaped side wall portion. The first shell 50 has a rectangular frame structure composed of the two metal parts. Each of the two metal parts is formed through processing for bending a metal plate. Curved portions 51a and 52a which are curved toward the inside of the rectangular frame structure are formed respectively on upper ends of side wall portions 51 positioned on two long sides of the rectangular frame structure and upper ends of side wall portions 52 positioned on two short sides of the same.

Two belt-like extending portions 53 which extend toward the inside of the rectangular frame structure are formed on the lower ends of the side wall portions 51. On the lower end of the first shell 50, notches 58 making it easy to bend the extending portion 53 are formed on both sides of the extending portion 53. The extending portion 53 is bent at two or more spots. In the rectangular frame structure, one extending portion 53 on one side wall portion 51 and one extending portion 53 on the other side wall portion 51 face each other, and the other extending portion 53 on one side wall portion 51 and the other extending portion 53 on the other side wall portion 51 face each other.

The extending portion 53 has a bottom portion which extends toward the inside of the rectangular frame structure from the side wall portion 51, a raised portion 53a which extends orthogonally upward from the bottom portion, a top portion which extends toward the inside of the rectangular frame structure from the raised portion 53a, and a bent portion 54 which extends orthogonally downward from the top portion and furthermore is bent orthogonally upward to have a staple shape. The bent portion 54 of one extending portion 53 and the bent portion 54 of the other extending portion 53 facing the one extending portion 53 are positioned on the same plane and a leg portion 54a positioned on the end of the former bent portion 54 and a leg portion 54a positioned on the end of the latter bent portion 54 are close to each other. Two protrusions 53b protrude from the raised portion 53a in the length direction of the rectangular frame structure.

Two first cutouts 55 are formed on the lower end of the side wall portion 51. The positions of the two first cutouts 55 are closer to the center of the metal parts than the positions of the two extending portions 53. The position of the first cutout 55 corresponds to the position of the connection portion 42b of the first terminal 42 which is exposed from the bottom surface of the first insulator 30. In the first shell 50 having the rectangular frame structure, the two metal parts form a small gap 56. A first cutout 57 which is like a chamfer is formed on each of the lower ends of the side wall portions 52 positioned on both sides of the gap 56.

The first shell 50 is put over the first insulator 30 and is further forced into the first insulator 30, thus being attached to the first insulator 30. The raised portions 53a of four extending portions 53 are pressed into four concave portions 31 of the first insulator 30 respectively. The bent portions 54 of the extending portions 53 are inserted into slits 32 of the first insulator 30. As a result, the first connector 100 illustrated in FIGS. 3A and 3B is completed.

Figure 6A:
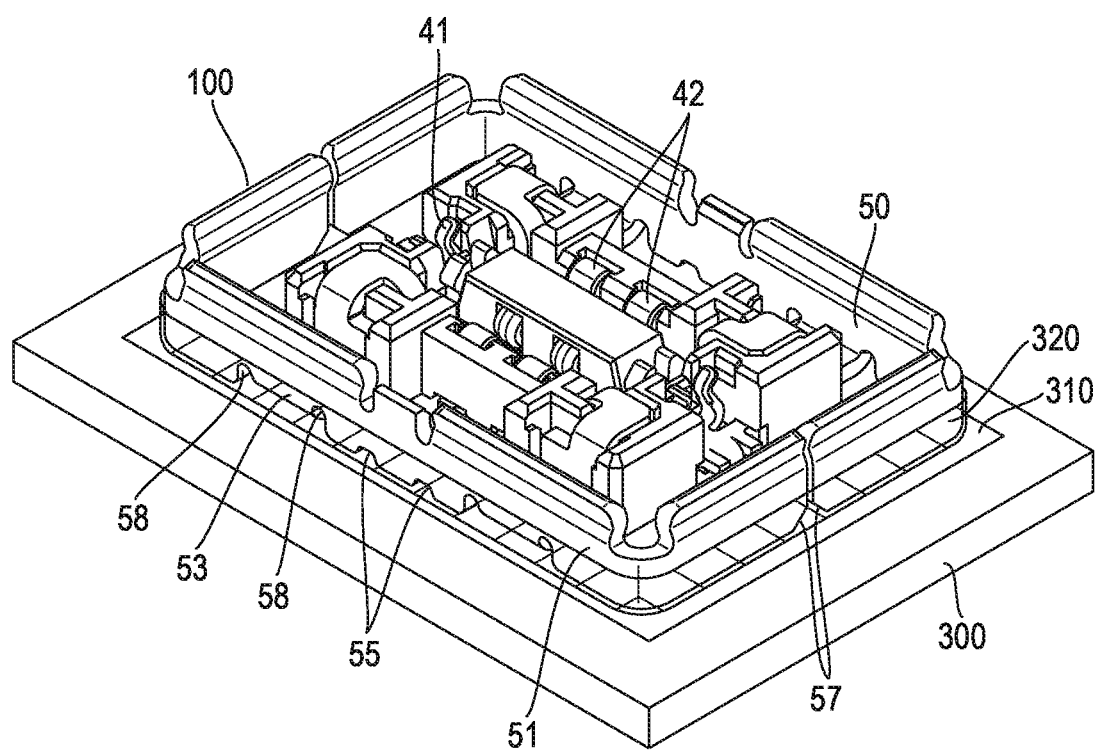
FIG. 6A is a perspective view illustrating the first connector that is mounted on a first board.
Figure 6B:
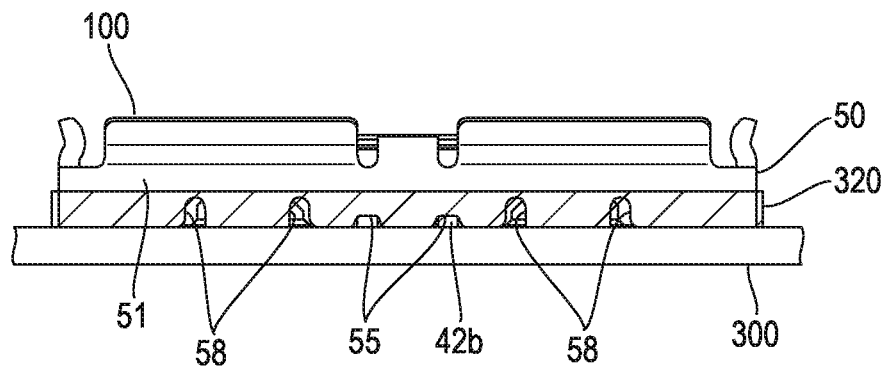
FIG. 6B is a front elevational view illustrating the first connector that is mounted on the first board.

FIGS. 6A and 6B illustrate the first connector 100 that is mounted on a first board 300. Hidden and not seen in FIGS. 6A and 6B, the connection portions 41b and 42b of the first terminals 41 and 42 are soldered on a pad of the first board 300. The connection portion 42b of the first terminal 42 can be visually observed through the first cutout 55 from the outside of the side wall portion 51 of the first shell 50, so the position or the soldering state of the connection portion 42b can be checked.

In this example, a first ground pattern 310 having a rectangular frame-like shape corresponding to the frame-like shape of the first shell 50 is formed on the first board 300. The first shell 50 and the first ground pattern 310 are soldered to each other with first solder 320 provided along the whole circumference of the first ground pattern 310. For convenience sake, the first solder 320 is drawn without any colors and is hatched in FIGS. 6A and 6B.

The above-mentioned first cutouts 55 and 57 and notches 58 are closed with the first solder 320 as illustrated in FIGS. 6A and 6B.

The second connector 200 will be subsequently described.

Figure 7A:
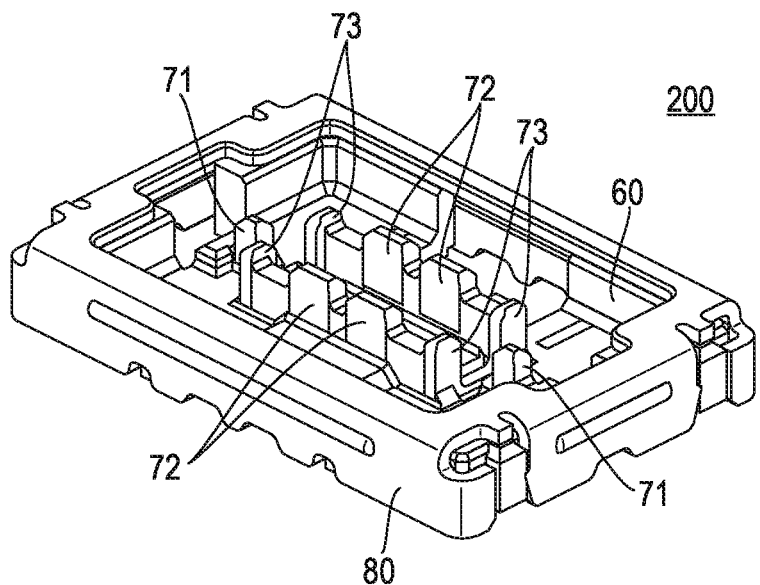
FIG. 7A is an upper perspective view illustrating a second connector constituting the connector assembly according to the embodiment.
Figure 7B:
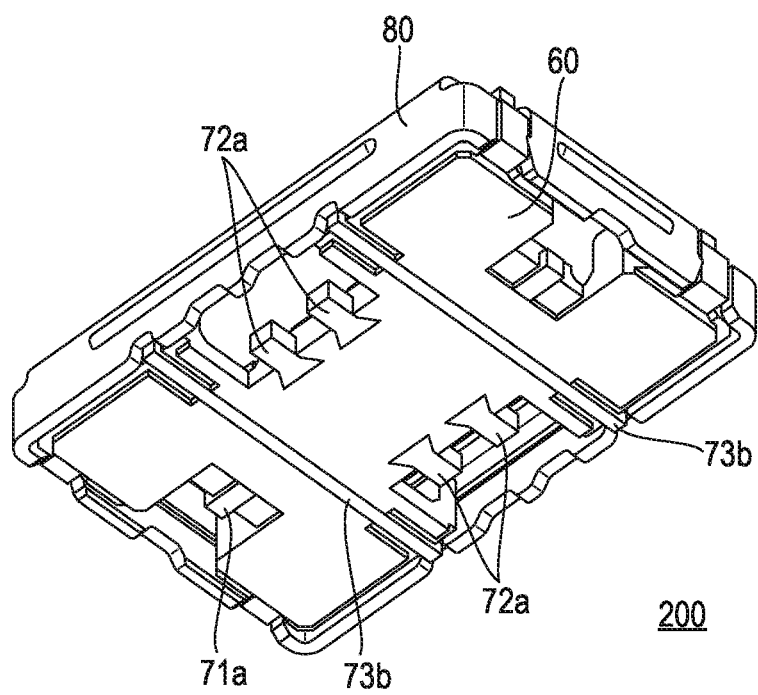
FIG. 7B is a lower perspective view illustrating the second connector constituting the connector assembly according to the embodiment.
Figure 8:
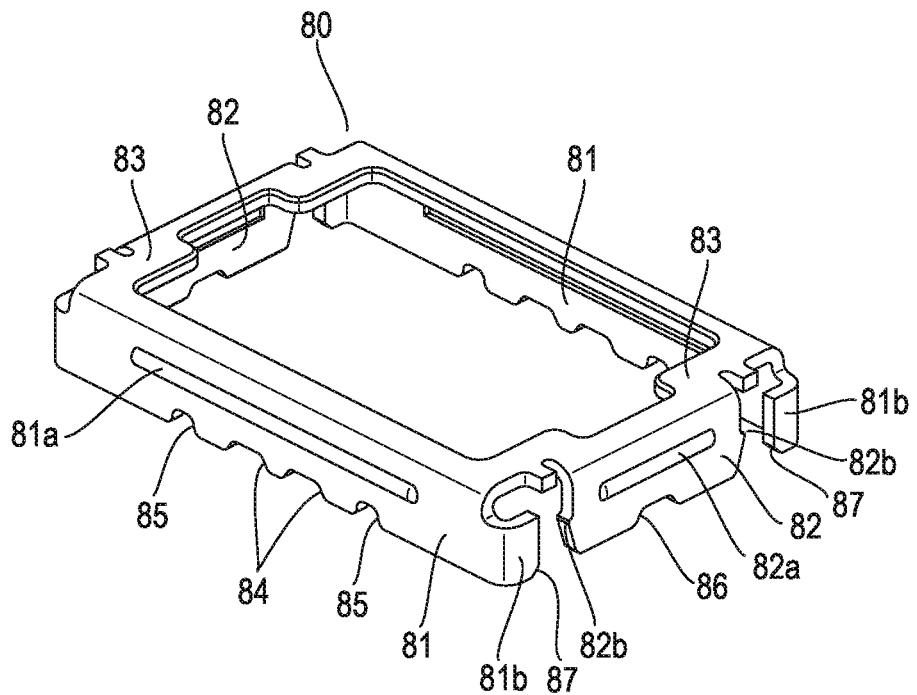
FIG. 8 is a perspective view illustrating a second shell included in the second connector.
Figure 9:
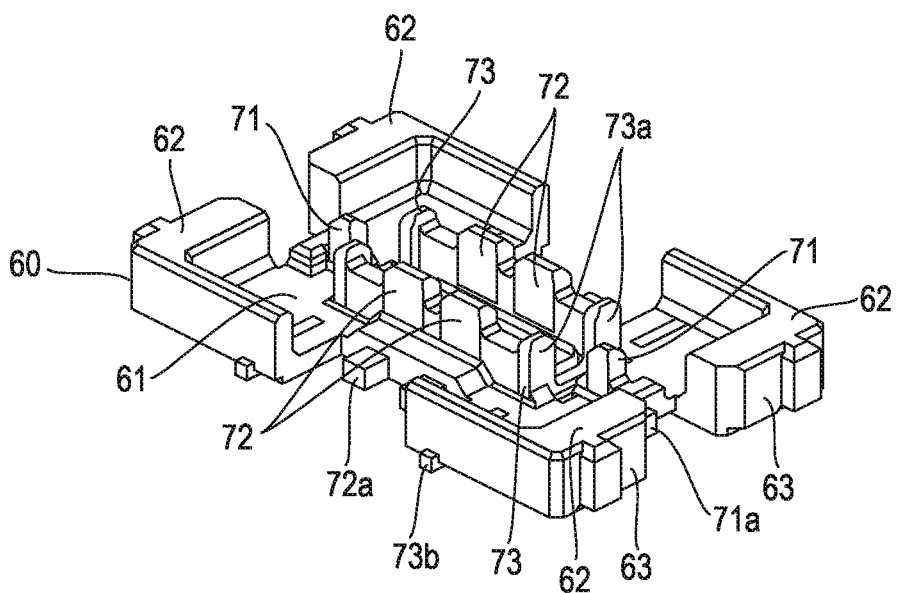
FIG. 9 is a perspective view illustrating a second insulator included in the second connector (where second terminals are attached to the second insulator which is illustrated)

FIGS. 7A and 7B illustrate the second connector 200. The second connector 200 includes a second insulator 60, second terminals 71 and 72 which are held by the second insulator 60, shielding plates 73 which are held by the second insulator 60, and a second shell 80 which is an outer shell of the second connector 200 and has conductivity and a rectangular frame-like shape. FIG. 8 illustrates details of the second shell 80 and FIG. 9 illustrates the second connector 200 whose second shell 80 is detached.

The second insulator 60 is made of resin and includes a bottom plate portion 61 and four side walls 62 which are respectively provided to four corner portions of the bottom plate portion 61. The second terminal 71 is attached to each of both longitudinal end portions of the bottom plate portion 61. Four second terminals 72 are attached to the central portion of the bottom plate portion 61. One shielding plate 73 is located between one second terminal 71 and four second terminals 72 and one shielding plate 73 is located between the other second terminal 71 and the four second terminals 72.

The second terminal 71 having a columnar shape includes a connection portion 71a, which is to be connected with the second board, on the lower end thereof. The second terminal 72 having a plate-like shape includes a connection portion 72a, which is to be connected with the second board, on the lower end thereof. The second terminal 71 is used for transmission of a high frequency signal and the second terminal 72 is used for transmission of a low frequency signal.

The shielding plate 73 includes an extending portion 73b which is elongated and two columnar portions 73a which extend from the extending portion 73b, and the two columnar portions 73a protrude upward from the bottom plate portion 61. The extending portion 73b is a connection portion to be connected with the second board.

The second shell 80 which has a rectangular frame-like shape is formed through processing for bending a metal plate. As illustrated in FIG. 8, the second shell 80 includes side wall portions 81 that are respectively positioned on two long sides of the rectangular frame, side wall portions 82 that are respectively positioned on two short sides of the rectangular frame, and two coupling portions 83 that couple the upper ends of the side wall portions 81 and the upper ends of the side wall portions 82 to each other. The two coupling portions 83 include plate surfaces that partially close both longitudinal ends of the rectangular frame. Second cutout portions 87 are formed on lower ends of extending portions 81b which are positioned on both sides of the side wall portion 82.

An elongated convex portion 81a which extends in the side direction is formed on the outer surface of the side wall portion 81. An elongated convex portion 82a which extends in the longitudinal direction is formed on the outer surface of the side wall portion 82. The extending portions 81b bent toward the side wall portion 82 are formed on both ends in the longitudinal direction of the side wall portion 81.

Two second cutouts 84 are formed on the lower end of the side wall portion 81. Two second cutouts 85 are further formed on the lower end of the side wall portion 81. The two second cutouts 84 are positioned between the two second cutouts 85. The second cutout 84 corresponds to the position of the connection portion 72a of the second terminal 72 which is exposed from the bottom surface portion of the second insulator 60. The second cutout 85 corresponds to the position of the extending portion 73b of the shielding plate 73 which is exposed from the bottom surface portion of the second insulator 60. A second cutout 86 is formed on the lower end of the side wall portion 82. Protrusions 82b protrude outward from both ends in the longitudinal direction of the side wall portion 82. The second shell 80 is attached to the second insulator 60. The second shell 80 is put over the second insulator 60 and is further forced into the second insulator 60, thus being attached to the second insulator 60. The side wall portion 82 is pressed into a concave portion 63 which is formed on the outer sides of the side walls 62 in a manner to straddle two side walls 62. As a result, the second connector 200 is completed.

Figure 10A:
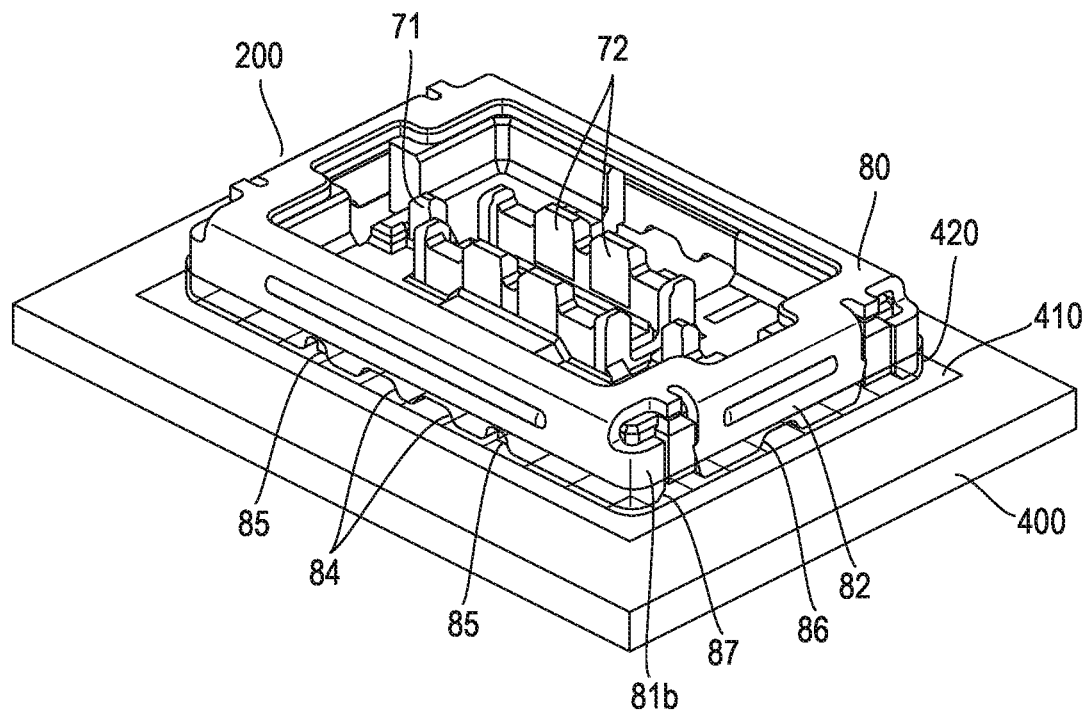
FIG. 10A is a perspective view illustrating the second connector that is mounted on a second board.
Figure 10B:
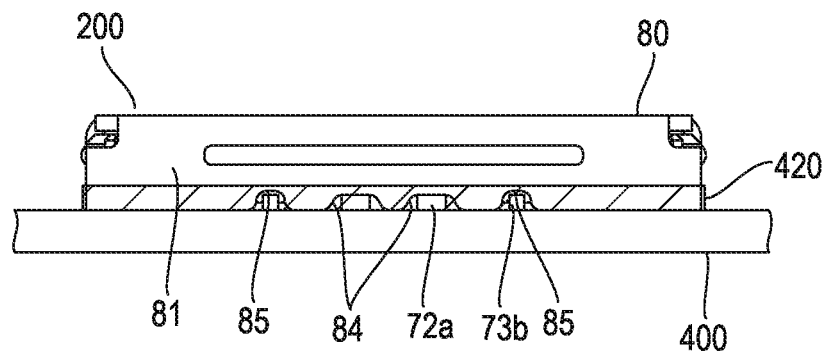
FIG. 10B is a front elevational view illustrating the second connector that is mounted on the second board.

FIGS. 10A and 10B illustrate the second connector 200 that is mounted on a second board 400. Hidden and not seen in FIGS. 10A and 10B, the connection portions 71a and 72a of the second terminals 71 and 72 are soldered on a pad of the second board 400. The connection portion 72a of the second terminal 72 can be visually observed through the second cutout 84 from the outside of the side wall portion 81 of the second shell 80, so the position or the soldering state of the connection portion 72a can be checked.

In this example, a second ground pattern 410 having a rectangular frame-like shape corresponding to the frame-like shape of the second shell 80 is formed on the second board 400. The second shell 80 and the second ground pattern 410 are soldered to each other with second solder 420 provided along the whole circumference of the second ground pattern 410. For convenience sake, the second solder 420 is drawn without any colors and is hatched in FIGS. 10A and 10B.

The above-mentioned second cutouts 84 and 85, second cutout 86, and second cutout portion 87 are closed with the second solder 420 as illustrated in FIGS. 10A and 10B. End portions of the extending portions 73b in the shielding plate 73 are positioned in the second cutouts 85. The end portions of the extending portions 73b and the second shell 80 are both soldered on the second ground pattern 410 with the second solder 420.

Figure 11:
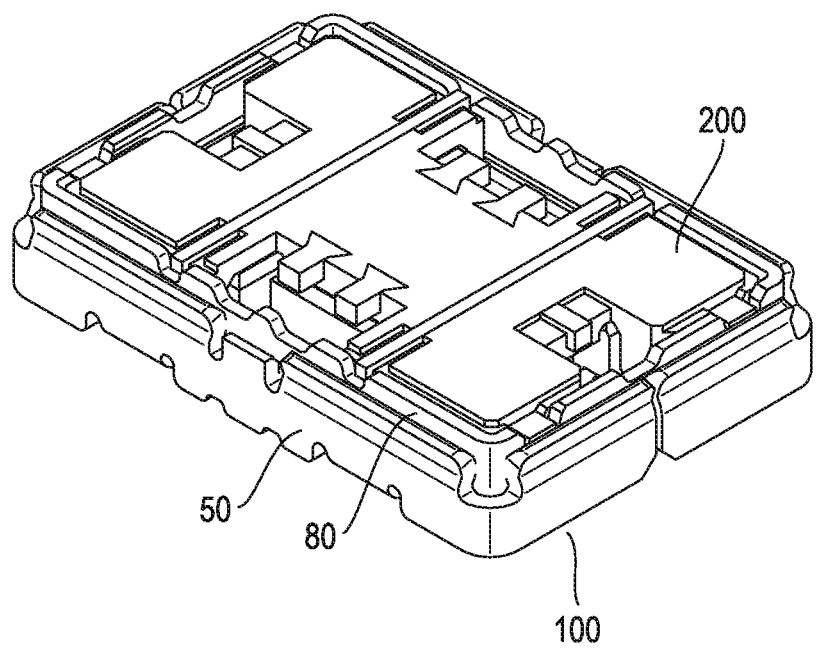
FIG. 11 is a perspective view illustrating the connector assembly according to the embodiment.
Figure 12:
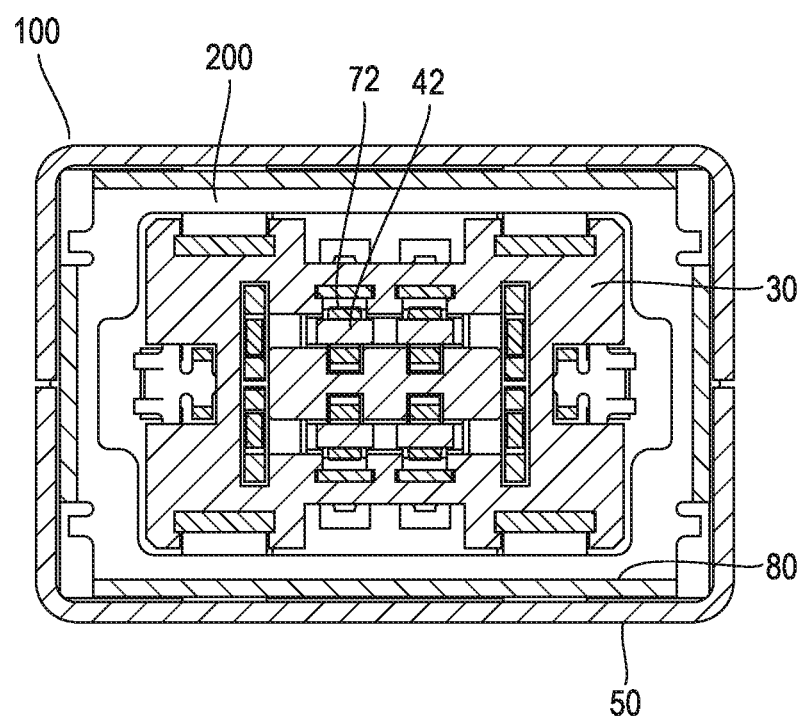
FIG. 12 is a sectional view illustrating the connector assembly according to the embodiment.
Figure 13:
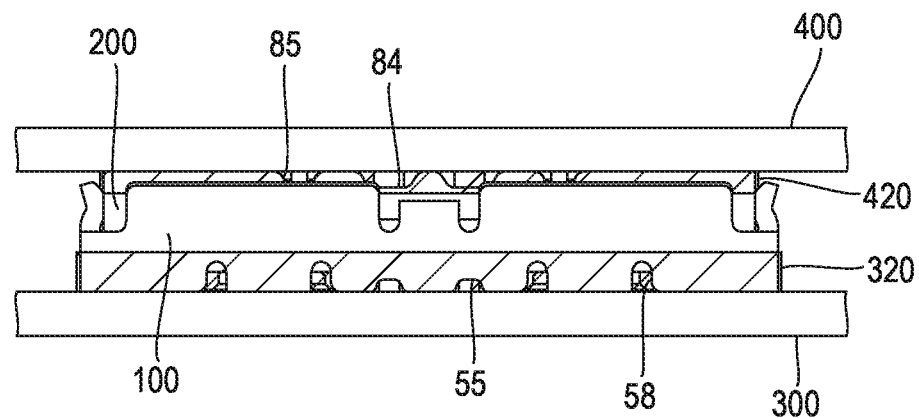
FIG. 13 is a front elevational view illustrating the connector assembly according to the embodiment.

The first connector 100 and the second connector 200 are connected with each other in a state in which the first board 300 and the second board 400 are parallel to each other. FIG. 11 illustrates a connector assembly in which the first connector 100 and the second connector 200 are connected with each other. FIG. 11 omits the illustration of the first board 300 and the second board 400. FIG. 12 illustrates a cross sectional surface of the connector assembly illustrated in FIG. 11. FIG. 13 is a front elevational view of the connector assembly.

In the connector assembly, the first terminals 41 and the second terminals 71 are connected with each other, and the first terminals 42 and the second terminals 72 are connected with each other. The convex portions 81a and 82a formed on the second shell 80 respectively climb over the curved portions 51a and 52a of the first shell 50 and thus, the second shell 80 is housed inside the first shell 50. The leg portions 54a of the bent portions 54 are fitted between two columnar portions 73a of the shielding plate 73 and substantially fill in a gap formed between the two columnar portions 73a. Accordingly, a shield is formed between a joint, between the first terminal 41 and the second terminal 71 for transmitting a high frequency signal, and a joint, between the first terminals 42 and the second terminals 72 for transmitting a low frequency signal.

In the connector assembly illustrated in FIG. 13, a space that is between the first board 300 and the second board 400 and that is surrounded by the first ground pattern 310 and the second ground pattern 410 when viewed from a direction perpendicular to both plate surfaces of the first board 300 and the second board 400 (the first terminals 41 and 42 and the second terminals 71 and 72 are positioned in this space) is completely shielded from the outside without any gap by at least one of the first shell 50, the first solder 320, the second shell 80, and the second solder 420 when viewed from any direction parallel to both plate surfaces of the first board 300 and the second board 400. Accordingly, the connector assembly exerts excellent electromagnetic shielding performance.

The structure without the first cutouts 55 or second cutouts 84 and the structure without the first cutouts 55 and second cutouts 84 is acceptable.

<Addendum>

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims.

Moreover, the use of the terms "first", "second", "i-th", etc., if any, do not denote any order or importance, but rather the terms "first", "second", "i-th", etc. are used to distinguish one element from another. The term "first" does not necessarily mean "coming before all others in order". The terminology used herein is for the purpose of describing particular embodiments only and is not intended to limit the invention in any way. As used herein, the singular forms "a", "an" and "the" are intended to include the plural forms as well, unless the context clearly indicates otherwise. It will be further understood that the terms "comprise", "comprises", and/or "comprising," when used in this specification and/or the appended claims, specify the presence of stated features, steps, operations, elements, and/or components, but do not preclude the presence or addition of one or more other features, steps, operations, elements, components, and/or groups thereof. The same goes for "include", "includes", and/or "including". The term "and/or", if any, includes any and all combinations of one or more of the associated listed items. In the claims and the specification, unless otherwise noted, "connect", "join", "couple", "interlock", or synonyms therefor and all the word forms thereof, if any, do not necessarily deny the presence of one or more intermediate elements between two elements, for instance, two elements "connected" or "joined" to each other or "interlocked" with each other. Connection between elements, if required, may be physical connection, electrical connection, or a combination thereof. In the claims and the specification, unless otherwise noted, the term "arbitrary", if any, should be understood as a term having the same meaning as the universal quantifier ∀. For example, the expression "for arbitrary X" has the same meaning as "for every X" or "for each X".

Unless otherwise defined, all terms (including technical and scientific terms) used herein have the same meaning as commonly understood by those skilled in the art to which the invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual techniques or steps in an unnecessary fashion. Nevertheless, the specification and claims should be read with the understanding that such combinations are entirely within the scope of the invention and the claims.

The corresponding structures, materials, acts, and equivalents of all means or step plus function elements in the claims below, if any, are intended to include any structure, material, or act for performing the function in combination with other claimed elements as specifically claimed.

The foregoing description of the embodiments of the invention has been presented for the purpose of illustration and description. It is not intended to be exhaustive and to limit the invention to the precise form disclosed. Modifications or variations are possible in light of the above teaching. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A connector assembly having
a first connector that includes a first insulator, two or more first terminals held by the first insulator, and a first shell having a frame-like shape, and is mounted on a first board; and a second connector that includes a second insulator, two or more second terminals held by the second insulator, a shielding plate held by the second insulator and positioned between the two or more second terminals, and a second shell having a frame-like shape, and is mounted on a second board, wherein the first connector and the second connector are connected with each other in a state in which the first board and the second board are parallel to each other, the two or more first terminals and the two or more second terminals are connected with each other, and the first shell and the second shell are connected with each other, the connector assembly comprising:
a ground pattern having a frame-like shape and formed on the second board, the ground pattern being soldered to the second shell with solder provided along a whole circumference of the ground pattern, wherein
the shielding plate includes an extending portion that extends to the second shell,
two or more cutouts are formed on positions, the positions corresponding to both ends of the extending portion, on a lower end of the second shell, the lower end of the second shell facing the second board,
both ends of the extending portion are respectively positioned on the two or more the cutouts and are soldered together with the second shell to the ground pattern with the solder.

* * * * *